United States Patent
Bolton et al.

(10) Patent No.: US 6,476,623 B1
(45) Date of Patent: Nov. 5, 2002

(54) PERCENT BACKSPUTTERING AS A CONTROL PARAMETER FOR METALLIZATION

(75) Inventors: Scott C. Bolton, Austin, TX (US); Dean J. Denning, Del Valle, TX (US); Sam S. Garcia, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 46 days.

(21) Appl. No.: 09/666,759

(22) Filed: Sep. 21, 2000

(51) Int. Cl.[7] .................... G01R 27/08; G01R 31/26; H01L 21/31
(52) U.S. Cl. .................... 324/716; 324/719; 324/765; 438/761; 438/762; 438/763
(58) Field of Search ................ 324/716, 719, 324/765; 438/761, 762, 763, 648, 687, 14, 17, 18, 643, 653

(56) References Cited

U.S. PATENT DOCUMENTS

| | | | |
|---|---|---|---|
| 3,926,747 A | * 12/1975 | Newby et al. | 205/118 |
| 4,886,765 A | * 12/1989 | Chen et al. | 438/301 |
| 4,933,304 A | * 6/1990 | Chen et al. | 438/618 |
| 5,421,976 A | * 6/1995 | Holmquist | 204/192.15 |
| 5,675,310 A | * 10/1997 | Wojnarowski et al. | 338/309 |
| 5,737,177 A | 4/1998 | Mett et al. | 361/234 |
| 5,812,361 A | 9/1998 | Jones et al. | 361/234 |
| 5,942,889 A | 8/1999 | Loewenhardt et al. | 324/72.5 |
| 5,989,349 A | 11/1999 | Ke et al. | 118/728 |
| 6,258,466 B1 | * 1/2000 | McTeer | 428/627 |
| 6,169,027 B1 | * 1/2001 | Dobson | |
| 6,193,855 B1 | * 2/2001 | Gopalraja et al. | 204/192.12 |
| 6,200,911 B1 | * 3/2001 | Narwqankar et al. | |

* cited by examiner

*Primary Examiner*—Christine K. Oda
*Assistant Examiner*—Wasseem H. Hamdan
(74) *Attorney, Agent, or Firm*—James L. Clingan, Jr.

(57) ABSTRACT

A method for depositing a first metal layer such as tantalum or copper on a patterned semiconductor wafer using a metal sputtering tool that typically includes an electrically biased wafer chuck is disclosed. Initially, a first test wafer is placed on the wafer chuck and a first test layer of materials is deposited on the first test wafer. During the deposition of the first test layer on the first test wafer, the wafer receives the electrical bias at a first level. A second test wafer is then placed on the wafer chuck and a second test layer of material is deposited with the second wafer receiving a second level of electrical bias. The difference in thickness between the first layer and the second layer is then determined. If the difference in thickness is within a predetermined range, the metal sputtering chamber is qualified to deposit a production layer on a production semiconductor wafer.

12 Claims, 2 Drawing Sheets

US 6,476,623 B1

PERCENT BACKSPUTTERING AS A CONTROL PARAMETER FOR METALLIZATION

FIELD OF THE INVENTION

The present invention is related to the field of semiconductor fabrication and more particularly to a method of monitoring and controlling metallization using percent backsputtering as a control parameter to achieve low contact resistance and interface void-free metal layer.

RELATED ART

In the field of semiconductor fabrication, the use of copper metallization for high speed semiconductor devices is becoming increasingly prevalent. In a typical copper metallization process, a barrier layer is deposited over an underlying first copper layer using a physical vapor deposition (PVD) process. Referring to FIG. 1, a diagram of a metal sputtering tool 100 (also referred to herein as metal sputtering chamber 100) is presented.

In the depicted embodiment, sputtering tool 100 includes a chassis 102 that defines a chamber 101 and encloses a sputter target 104 that is comprised at least partially of a material to be deposited on a wafer surface. Sputter target 104 may include tantalum, tantalum nitride, titanium, titanium nitride, copper, or other metal elements suitable for use in a semiconductor interconnect structure.

The depicted embodiment of sputtering tool 100 is characteristic of commercially distributed ionized metal plasma deposition tools such as the Endura® line of sputtering tools from Applied Materials, Inc. A DC power supply 106 provides a bias to sputtering target 104 while a rotating magnetic assembly 116 provides a magnetic field within chamber 101 of sputtering tool 100. In addition, a radio frequency (RF) power supply 108 energizes a coil 109 within chamber 101. A platform 112 within chamber 101 is connected to an AC power supply 110. In one embodiment, RF power supply 108 operates at a frequency of approximately 2 MHz and an AC power supply 110 operates at a frequency of approximately 13.56 MHz.

As depicted in FIG. 1, a wafer 120 is placed within chamber 101. In one embodiment, wafer 120 is displaced above pedestal 112 by one or more electrically insulating buttons 114 typically comprised of a ceramic material. In other embodiments, wafer 120 may rest directly upon platform 112.

In the depicted embodiment, a gas inlet 116 provides means for introducing one or more source gases 118 into chamber 101 during deposition. Suitable source gasses 118 may include inert species such as argon, xenon, or helium as well as other source gases including nitrogen.

As an inert species such as argon is released into chamber 101, RF power source 108 generates a plasma that includes charged argon particles which are attracted to the target 104 by DC bias 106. As the relatively heavy argon particles strike target 104, target particles are released into chamber 101 where a certain percentage of the particles are charged in the plasma generated by RF source 108. These charged particles (as well as a certain percentage of uncharged target particles) traverse chamber 101 and are deposited on wafer 120.

The power used for DC power supply 106 and RF power supply 108 are typically in excess of 1000 W and can result in the generation of highly energetic particles. In addition, the plasma itself is generally sustained at a temperature of approximately 300° C. The combination of the highly energetic particles and plasma thermal energy can result in significant localized heating of the wafer where the sputter material is deposited. In the case of sputter depositing a barrier material such as tantalum over a metal such as copper, it is theorized that the localized heating may result in recrystallization of the copper or thermal expansion and subsequent contraction of the copper thereby resulting in the formation of voids beneath the tantalum layer.

Attempts at correlating the occurrence of such voids to conventional parameters such as the AC power applied during tantalum deposition have been generally unsuccessful in eliminating the formation of voids. It would therefore be desirable to correlate the occurrence of voids during a biased metallization process to a quantifiable parameter and to implement a method of characterizing and qualifying a sputtering tool 100 based on the determined parameter. It would be further desirable if implemented solution did not significantly increase the cost and complexity of the metallization process.

BRIEF DESCRIPTION OF THE DRAWINGS

The present invention is illustrated by way of example and not limitation in the accompanying figures, in which like references indicate similar elements, and in which.

Figure 1:
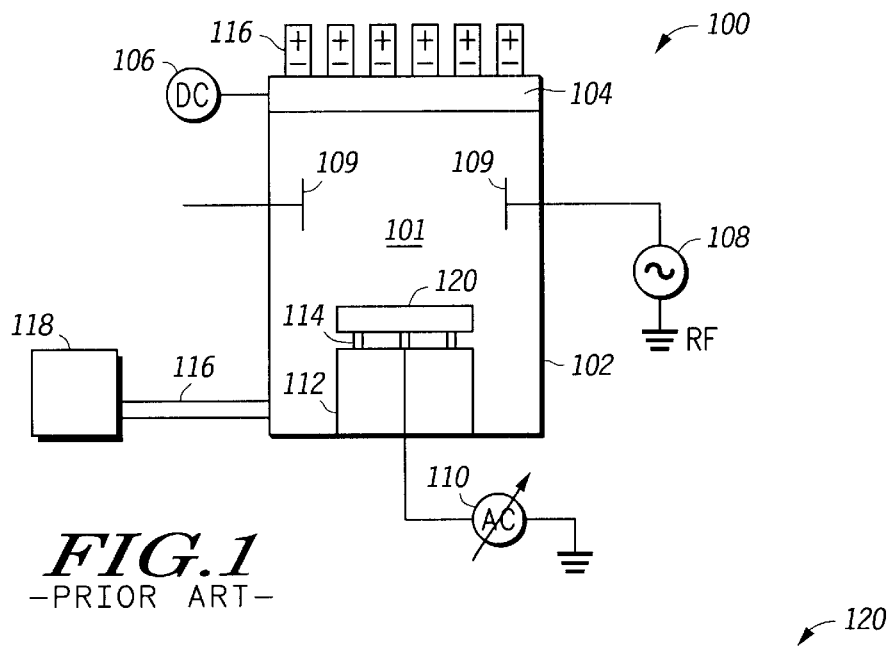
FIG. 1 is an illustration of a sputtering tool according to the prior art.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally speaking, one embodiment of the invention contemplates a method for depositing a first metal layer such as tantalum or copper on a patterned semiconductor wafer using a metal sputtering tool that typically includes an electrically biased wafer chuck. Initially, a first test wafer is placed on the wafer chuck and a first test layer of materials is deposited on the first test wafer. During the deposition of the first test layer on the first test wafer, the wafer receives the electrical bias at a first level. A second test wafer is then placed on the wafer chuck and a second test layer of material is deposited with the second wafer receiving a second level of electrical bias.

The difference in thickness between the first layer and the second layer is then determined. If the difference in thickness is within a predetermined range, the metal sputtering chamber is qualified to deposit a production layer on a production semiconductor wafer. A production wafer (also referred to as a patterned semiconductor wafer) is then placed on the wafer chuck and a production layer of a first metal such as tantalum is then deposited on the wafer. In one embodiment, the first level of bias zero and the production layer (as well as the second test layer) is deposited at the second level of bias.

Typically the predetermined range to which the difference in thickness between the first test layer and the second test layer is determined by first developing a relationship between a sputter parameter such as percent backsputtering and levels of the electrical bias for the sputter chamber. This relationship may be established by depositing tantalum on a plurality of wafers, each with a suitable test structure, using a plurality of electrical bias levels. An electrical test is then performed on the plurality of test structures. The electrical test, for example, may be a resistivity test that gives a proxy for the thickness of the deposited layer.

Criteria for passing the electrical test are then developed by a process development group based on the results of the electrical tests. After determining which of the plurality of test structures met the pass criteria, a range of levels of electrical bias that were used for the test structures which passed the test is then established and a range of backsputtering is established from the range of the levels of electrical bias.

Having an established bias and backsputtering range, the sputtering tool may be qualified for production using the two wafer procedure described above. If the thickness delta between the two test wafers falls out of specification, the bias level may be adjusted to bring the percent backsputtering within the predetermined range.

Figure 2:
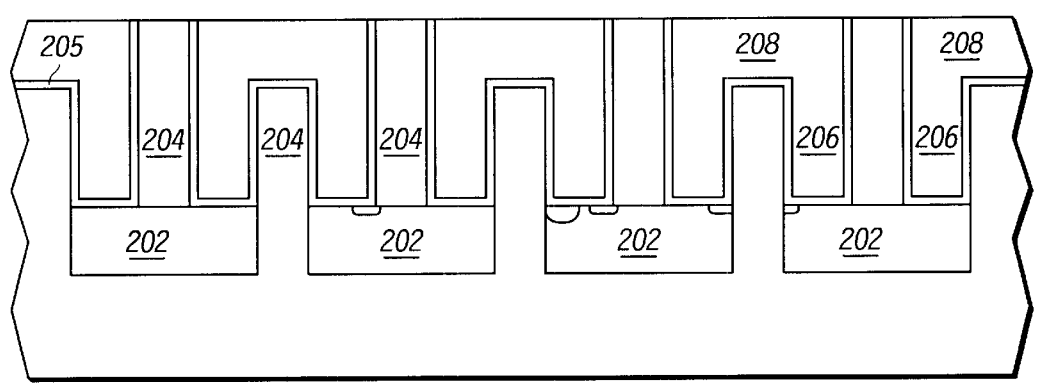
FIG. 2 is a partial cross sectional view of a semiconductor wafer illustrating a via chain.

Turning now to FIG. 2, a partial cross sectional view of a patterned semiconductor wafer 120 is depicted. In the depicted embodiment, wafer 120 includes a semiconductor substrate 200. Semiconductor substrate 200 typically includes a single crystalline silicon bulk and may include various processing levels between the semiconductor bulk and a first metal layer 202 shown in FIG. 2. The structure depicted in FIG. 2 is a contact string in which segments of a first metal layer 202 are interconnected within segments of a second metal layer 208 through intermediate via structures 206. An interlevel dielectric material (ILD) 204 provides electrical insulation between neighboring portions of the contact string.

Figure 3:
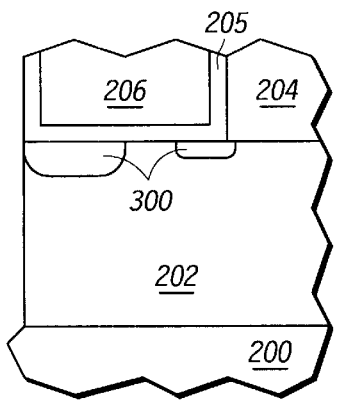
FIG. 3 is an exploded view of a portion of the semiconductor wafer of FIG. 2 indicating voids formed under a barrier layer.

Referring to FIG. 3, a detailed view of portions of the semiconductor wafer depicted in FIG. 2 is presented. In the embodiment depicted in FIG. 3, a barrier layer 205 is deposited between the first metal layer 202 and the via structure 206. In one embodiment, first metal layer 202 and via structure 206 are comprised of a highly conductive metal such as, for example, copper. Barrier layer 205 is provided to prevent conductive particles in via 206 from migrating to adjacent metal lines through ILD 204.

As described previously, the formation of barrier layer 205 using metal sputtering deposition 201 can result in localized heating and recrystallization of first metal layer 202 that can result in the formation of voids 300 in first metal layer 202 subsequent to barrier layer deposition. It will be appreciated by those in the field of semiconductor fabrication that the presence of void 300 within a conductive interconnect layer can increase the resistance between the adjacent layers and can result in long term reliability problems. Therefore, it is highly desirable to eliminate the presence of voids 300. Unfortunately, the high power process used to deposit barrier layer 205 is believed to contribute to the formations of voids 300 that is necessary to achieve adequate step coverage of barrier layer 205.

The present invention contemplates that controlling the formation of voids 300 correlates well with a sputtering tool parameter referred to herein as percent backsputtering. The percent backsputtering of a sputtering tool may be measured as a function of the resistivity of a film deposited at zero bias relative to resistivity of a film deposited with an applied bias. More specifically the percent backsputtering of sputtering tool 100 is defined in one embodiment of the invention as $((Rs_{on}/Rs_{off})-1)* 100$ where $Rs_{on}$ refers to the sheet resistivity of a film deposited with a bias applied to pedestal 112 and Rsoff refers to the resistivity of a film deposited with zero bias supplied to pedestal 112.

Since resistivity provides a first order approximation of the thickness of a deposited film (other parameters being equal), resistivity is used in one embodiment of the invention as an indirect measure of film thickness. The percent backsputtering parameter is a measure of the thickness ratio between a film deposited on a wafer to which a bias is applied and a film deposited on a wafer where no bias is applied. In other embodiments, other measures of film thickness may be substituted for the resistivity measurement as a proxy for film thickness. Such other method includes x-ray techniques such as XRF and acoustic techniques.

The percent backsputtering parameter is indicative of the efficiency with which the metal sputtering tool couples energy in the plasma to the wafer surface. A high percent backsputtering, indicative of a sputtering tool in which the particles at the wafer surface are highly energetic, creates a film that is significantly thinner than a film deposited with no applied bias (and all other deposition parameters being equal). Each deposition tool may vary in the efficiency with which an applied bias translates into the energy with which chamber particles strike the wafer surface. Thus, a first metal sputtering tool operated at a predetermined power may result in significantly more or less localized heating of the wafer than a second sputtering tool operated at the same power.

Moreover, the efficiency or percent backsputtering of a single sputtering deposition tool may vary over time. Thus, the power applied to the pedestal 112 is only indirectly related to the effective power at the wafer surface. It is theorized that the percent backsputtering parameter relates more directly to the effective power at the wafer surface during the deposition process. Therefore, the invention contemplates tracking percent backsputtering as a means for maintaining process control in metal sputtering tool 100.

Figure 4:
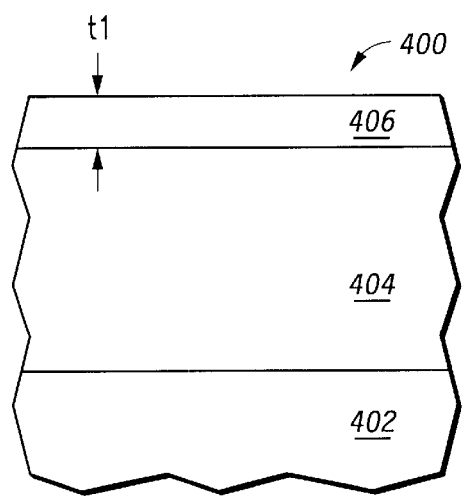
FIG. 4 is a partial cross sectional view of a first wafer used in a method for qualifying the deposition tool of FIG. 1.
Figure 5:
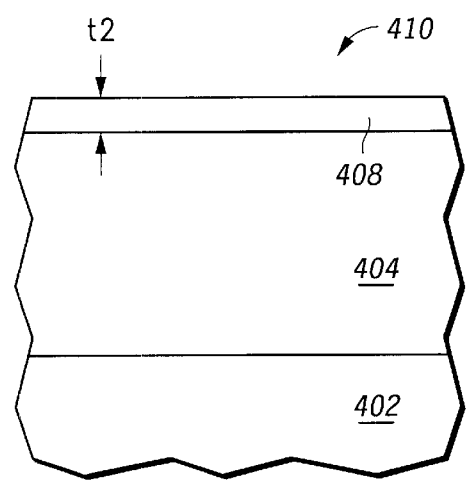
FIG. 5 is a partial cross sectional view of a second wafer used to qualify the deposition tool of FIG. 1 according to one embodiment of the invention.

Referring now to FIGS. 4 and 5, cross sectional views of first and second test wafers are depicted to illustrate a method of measuring the percent backsputtering parameter of sputtering tool 100 as a means of qualifying the tool for production processing. In one embodiment, a method for determining the percent backsputtering of a metal sputtering tool includes placing a first test wafer 400 in chamber 101 of sputtering tool 100. Typically, the first test wafer 400 includes a dielectric layer 404 formed over a silicon bulk 402. Dielectric layer 404 may comprise a silicon dioxide or other suitable dielectric material.

A first layer 406 is then deposited on dielectric layer 404 of first test wafer 400. In one embodiment, first layer 406 is deposited with sputtering tool 100 using a DC power in the range of approximately 1000–2000 watts, an RF power in the range of approximately 1500–3000 watts, a pressure of approximately 20–40 millatorr and a deposition time of approximately 30–60 seconds thereby resulting in the formation of a first layer 406 with a thickness $t_1$. In an embodiment where first layer 406 comprises tantalum, the thickness $t_1$ is suitably in the range of approximately 38–42 nanometers. In another embodiment suitable for qualifying a copper metallization process, an intermediate layer (not depicted) of tantatulum is typically deposited prior to depositing a copper first layer 406 having a thickness suitably in the range of approximately 18–22 nanometers. In one embodiment, zero bias is applied to pedestal 112 via AC power supply 110 during the deposition of first layer 406.

To determine the percent backsputtering characteristic of chamber 101, a second test wafer 410 is used to form a second layer 408. The deposition parameters used to deposit second layer 408 on second test wafer 410 are substantially identical to the deposition parameters used to form first layer 406 on first test wafer 400 except that an AC power is applied to pedestal 112 during the formation of second layer 408. In one embodiment, the deposition of second layer 408 on second test wafer 410 includes two portions, during a first portion of the deposition, zero bias is applied to pedestal 112 via AC power supply 110. During the second portion, a predetermined power is applied to pedestal 112 via AC power supply 110. The thickness of the resulting second layer 408 is identified in FIG. 5 by the reference numeral $t_2$. The relative thicknesses $t_1$, and $t_2$ of first layer 406 and second layer 408 respectively are indicative of the percent backsputtering of sputtering tool 100.

If the deposition tool is highly efficient in coupling applied power to the wafer surface, a significant amount of backsputtering will occur and the second layer 408 will be significantly thinner than the first layer 406. If on the other hand sputtering tool 100 is inefficient in coupling power to the wafer surface, little backsputtering will occur and the thickness $t_2$ will be substantially equal to the thickness $t_1$, of first layer 406. In one embodiment, the thicknesses $t_1$, and $t_2$ of first layer 406 and second layer 408 respectfully are measured indirectly using sheet resistance as a parameter. In this embodiment, the percent backsputtering is determined from the relative sheet resistances of the films.

If the difference between the second thickness $t_2$ and first thickness $t_1$, is within a predetermined range, the percent backsputtering characteristic of sputtering tool 100 is within specification and the tool may be used to process production wafers. If the test wafer thicknesses indicate that the percent backsputtering of the deposition tool is out of specification, the power may be adjusted to bring the percent backsputtering within the predetermined range.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for depositing a production layer of tantalum on a patterned semiconductor wafer, comprising the steps of:

providing a metal sputtering chamber having a wafer chuck, wherein the wafer chuck receives an electrical bias; and placing a first test wafer on the wafer chuck;

depositing a first layer of tantalum on the first test wafer with the wafer receiving the electrical bias at a first level;

placing a second test wafer on the wafer chuck;

depositing a second layer of tantalum on the second test wafer receiving the electrical bias at a second level;

determining a difference in thickness between the first layer and the second layer;

determining if the difference in thickness is within a predetermined range;

placing the patterned semiconductor wafer on the wafer chuck; and depositing the production layer of tantalum on the patterned semiconductor wafer if the difference in thickness is within the predetermined range.

2. The method of claim 1, where in the first level is zero.

3. The method of claim 1, wherein the step of depositing the production layer of tantalum occurs with bias voltage at the second level.

4. A method for depositing a production layer of tantalum on a patterned semiconductor wafer, comprising the steps of:

providing a sputtering chamber having a wafer chuck, wherein the wafer chuck receives an electrical bias;

measuring a ratio between percent backsputtering and levels of the electrical bias for the sputter chamber;

providing a plurality of wafers with a test structure;

depositing tantalum on the plurality of wafers at a plurality of the levels of electrical bias;

running an electrical test of the plurality of test structures;

establishing a criteria for passing the electrical test;

determining which of the plurality of test structures met the criteria for passing the test determining a range of levels of electrical bias that were used for the test structures which passed the test; and determining a predetermined percent backsputtering range from the range of the levels of electrical bias;

placing a first test wafer on the wafer chuck;

depositing a first layer of tantalum on the first test wafer with the wafer receiving the electrical bias at a first level;

placing a second test wafer on the wafer chuck;

depositing a second layer of tantalum on the second test wafer receiving the electrical bias at a second level;

determining a difference in thickness between the first layer and the second layer to determine the percent backsputtering;

determining if the percent backsputtering is within the predetermined percent backsputtering range;

placing the patterned semiconductor wafer on the wafer chuck; and depositing the production layer of tantalum on the patterned semiconductor wafer if the difference is within the predetermined percent backsputtering range.

5. The method of claim 4, wherein the step of depositing the production layer of tantalum occurs with bias voltage at the second level.

6. A method for depositing a production layer of a first metal type on a patterned semiconductor wafer, comprising the steps of:

providing a sputtering chamber having a wafer chuck, wherein the wafer chuck receives an electrical bias; and placing a first test wafer on the wafer chuck;

depositing a first layer of the first metal type on the first test wafer with the wafer receiving the electrical bias at a first level;

placing a second test wafer on the wafer chuck;

depositing a second layer of the first metal type on the second test wafer receiving the electrical bias at a second level;

determining a ratio of thickness between the first layer and the second layer;

determining if the ratio of thickness is within a predetermined range;

placing the patterned semiconductor wafer on the wafer chuck; and depositing the production layer of the first metal type on the patterned semiconductor wafer if the ratio of thickness is within the predetermined range.

7. The method of claim 6, wherein the first metal type is tantalum.

8. The method of claim 6, wherein the first metal type is tantalum nitride.

9. The method of claim 6, wherein the first metal type is copper.

10. The method of claim 6, wherein the first metal type is titanium.

11. The method of claim 6, wherein the first metal type is titanium nitride.

12. The method of claim 6, wherein the ratio is determined as a ratio of an electrical conductivity of the first layer to an electrical conductivity of the second layer.

* * * * *